United States Patent [19]

Hughes

[11] 4,354,274
[45] Oct. 12, 1982

[54] DIGITAL SIGNAL TRANSMISSION SYSTEM
[75] Inventor: John B. Hughes, Sunnyvale, Calif.
[73] Assignee: U.S. Philips Corporation, New York, N.Y.
[21] Appl. No.: 194,508
[22] Filed: Oct. 6, 1980
[51] Int. Cl.[3] ............................................. H03D 3/24
[52] U.S. Cl. .................................. 375/120; 307/516; 328/134; 329/124
[58] Field of Search ................ 370/100; 375/119, 120; 307/231, 510, 514, 516; 328/133, 134; 329/122, 124

[56] References Cited

U.S. PATENT DOCUMENTS

| | | | |
|---|---|---|---|
| 3,806,632 | 4/1974 | Okada | 307/516 |
| 3,870,900 | 3/1975 | Malaviya | 307/516 |
| 4,001,603 | 1/1977 | Wilcox | 307/516 |

Primary Examiner—Benedict V. Safourek
Attorney, Agent, or Firm—Thomas A. Briody; Robert T. Mayer; Steven R. Biren

[57] ABSTRACT

A digital signal transmission system in which a pulse code modulated (PCM) signal is retimed in a regenerator using a decision circuit supplied by a clock, the frequency of which is half that of the bit rate (typically 1 Gigabit/second), and is demultiplexed using multiplexers clocked at a frequency half that of the bit rate. In each case the clock frequency is derived from the data stream using a clock extractor. A voltage controlled oscillator (VCO) generating a signal at substantially half the bit rate is connected to one input of a phase detector to another input of which is connected to receive current pulses representing transitions in the incoming data signal. The phase detector comprises first, second and third pairs of long tailed-pair connected transistors, the collectors of the transistors of the first pair of being connected respectively to the common connected transistors of second and third pairs. A first delay circuit providing a delay of approximately a quarter of a period of the VCO is connected between the base electrode of one of the first pair of transistors and the base electrode of one transistor of each of the second and third pairs of transistors. A second delay circuit of the same period as the first delay circuit is connected between the base electrode of the other of the first pair of transistors and the base electrode of the other transistor of each of the second and third pairs of transistors.

6 Claims, 11 Drawing Figures

(A) IN 46 | A | B | C | D | E | F | G | H | I | J |

(B) C 40,42

(C) X | A | B | C | D | E | F | G | H | I | J |

(D) Y | A | B | C | D | E | F | G | H | I | J | ..

(E) C 44

(F) OUT | A | B | C | D | E | F | G | H | I | J |

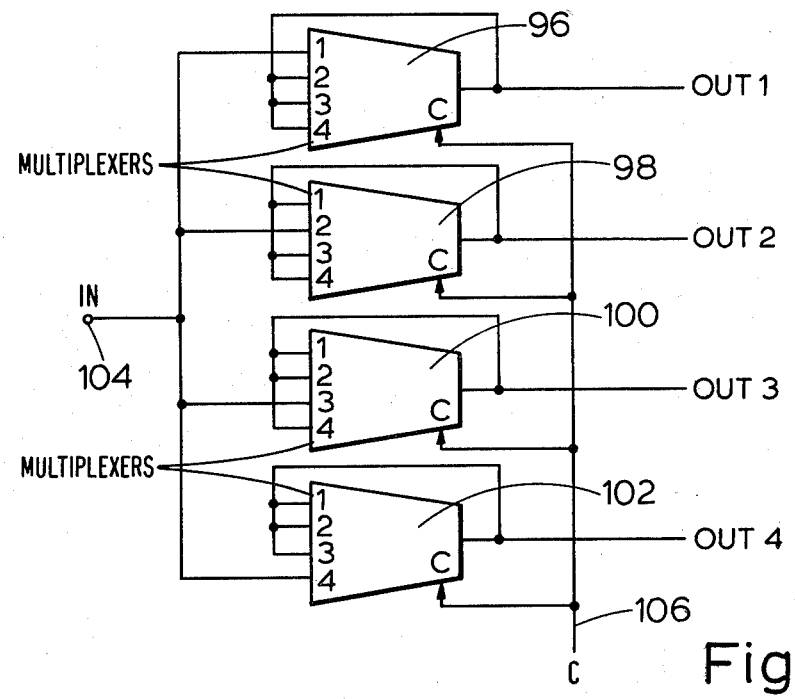

DIGITAL SIGNAL TRANSMISSION SYSTEM

BACKGROUND OF THE INVENTION

The present invention relates to digital signal transmission systems particularly, but not exclusively, for use at high bit rates in the Gigabit per second range.

In digital transmission systems using transmission media such as coaxial cables and optical fibers it is necessary to regenerate the signal being transmitted at various intervals and ultimately to de-multiplex the signal at the terminus of the transmission medium. At bit rates up to 500 Megabits/second the signal regeneration can be carried out using known ECL logic families. However 500 Megabits/second represents the typical maximum switching speed for known ECL logic families and accordingly other techniques are necessary when working at higher bit rates.

It has now been realized that the regeneration of signals and demultiplexing of signals in the Gigabit/second range and below can be carried out using circuit techniques based on multiplexers, for example the multiplexer disclosed in FIG. 6 of British Patent Specification No. 1,552,739. The prior-art multiplexer shown in FIG. 6 of this British Patent is a synchronous digital multiplexer which uses a series gating technique. It produces a cyclic timing pulse of a desired period which is then applied in turn to a series of ECL gates. Each of these gates includes a pair of emitter-coupled transistors, with the cyclic timing pulse being applied to the common emitter connection. An input signal is applied to the base of a first emitter-coupled transistor in each pair while the base of the second transistor in each pair is connected to a source of reference voltage. The collector of each first transistor is connected to ground, while the collector of each second transistor is connected to a common output bus which is connected to an emitter-follower output transistor. The prior art multiplexer shown in FIG. 6 of the aforementioned British patent is a four-input-port multiplexer, and is thus suited for use in the digital signal transmission system of the present invention. However, as mentioned hereinafter, other suitable four-input-port multiplexers may be used, as the precise configuration of this prior-art component is not an essential feature of the invention. Since it is possible to switch a multiplexer on each zero crossover of a clock signal, the clock signal need only have a frequency of half that customarily necessary when using known ECL circuit elements such as decision circuits for retiming signals and demultiplexers which normally require a clock frequency the same as that of the bit rate. Consequently the known elements are inherently incapable of operating at a frequency in excess of 500 MHz.

SUMMARY OF THE INVENTION

According to the present invention there is provided a phase-locked loop clock extractor for extracting a clock frequency of N/2 cycles per second from a transmitted pulse code modulated (PCM) data signal of N bits per second, the clock extractor including a voltage controlled oscillator (VCO) for generating a clock signal of the desired frequency, a circuit connected to receive the transmitted data signal and produce a pulse signal on each transition of the data signal from one logic level to another and vice versa, a phase detector for comparing the VCO output with the pulse signal produced by said circuit and means connected to the phase detector for producing a control signal which is usable to adjust the frequency generated by the VCO, characterized in that the phase detector comprises a first switching circuit operable on each half cycle of the VCO frequency to route said pulse signal to second and third switching circuits, each of the second and third switching circuits having first and second outputs, each of the second and third switching circuits being operable on each half cycle of the VCO frequency which has been delayed by a predetermined amount compared with the VCO frequency applied to the first switching circuit, to produce pulse trains on their first and second outputs, the pulses in each pulse train comprising complementary parts of the pulses routed to the second or third switching circuit by the first switching circuit, corresponding first parts of the pulses appearing on the first output of the second and third switching circuits being combined to form a first output signal and corresponding second parts of the pulses appearing on the second output of the second and third switching circuits being combined to form a second output signal, said first and second output signals being used by said means to produce the control signal.

The VCO signal applied to the second and third switching circuits may be delayed by approximately a quarter of the period of the VCO.

The clock extractor in accordance with the present invention is of simple construction and can produce the desired VCO frequency without resorting to frequency multiplication techniques which would complicate the circuit construction. Such a frequency multiplying technique is disclosed in a paper entitled "Demultiplexer using fast hybrid integrated ECL-gates for 1 Gbit/s PCM signals" by Reinhard Petschacher and Peter Russer and presented at the 7th European Microwave Conference. The technique proposed involves using two frequency doubler stages between the VCO and phase detector in a phase locked loop.

The present invention also provides a P.C.M. transmission system including at least one regenerator having a phase-locked loop clock extractor in accordance with the present invention and a decision circuit for retiming the signal received by the regenerator, the decision circuit comprising first and second four-input-port multiplexers each having an output, the odd-numbered input ports of the first multiplexer and the even numbered input ports of the second multiplexer being coupled to a signal input of the decision circuit, a connection from an output of the first multiplexer to its even-numbered input ports, a connection from an output of the second multiplexer to its odd-numbered input ports, a clock input of each of the first and second multiplexers being coupled to the VCO, the output of which is phased so that the zero cross-over occurs substantially midway through the bit period, and switching means connected to the outputs of the first and second multiplexers for selecting said outputs alternately, on each zero cross-over of the clock signal, to produce a retimed P.C.M. signal on its output.

The switching means may comprise a further four-input-port multiplexer, in which case the VCO signal applied to its clock input is delayed compared with that applied to the first and second multiplexers.

A decision circuit is known which is based on a D-type flip-flop arrangement in which the data presented to the input at the moment of each positive transition of the clock is stored, regenerated and delivered to the output for a whole bit period. A high speed data stream of say, for example, 1 Gigabits/second would require the same clock frequency and, as explained, such circuits cannot be fabricated in current ECL logic. Therefore a decision circuit based on multiplexers is one way of retiming signals at such high bit rates.

The system may further comprise a further regenerator including a limiting amplifier for restandardizing the amplitude of the signal received by the regenerator. Such a limiting amplifier may comprise a multiplexer having an even number of input ports, a clock input and an output, wherein the odd-numbered input ports are maintained at one logic level, the even numbered input ports are maintained at a second logic level and the clock input is connected to receive the P.C.M. signal to be restandardized.

The described limiting amplifier based on a multiplexer has been found to improve the "eye" opening of the signal on the input.

The present invention also relates to a P.C.M. transmission system including a receiver having a demultiplexer and a phase locked loop clock extractor in accordance with the present invention, the demultiplexer comprising an input and K multiplexers, each multiplexer having a gain greater than one, K input ports, an output and a clock signal input, the clock signal inputs being coupled together and to the VCO output which is phased such that the zero cross-over of the clock signal occurs midway through a data time slot period, the input of the demultiplexer being connected to the first input port of the first multiplexer, the second input port of the second multiplexer and so on till the Kth input port of the Kth multiplexer, the output of each multiplexer being connected to all the other of its input ports, whereby each multiplexer in turn samples the input for half a clock period and holds the signal occurring in the second half of the sampling period for (K-1) further sampling periods, that is (K-1)/2 clock periods.

In one embodiment of the invention $K=4$.

The demultiplexer described above is simpler in its construction than known demultiplexers which normally use a number of separate storage devices, such as flip-flops which are supplied with clock and data signals. In general, either the data is phased appropriately at the storage devices which then use a common clock or data is supplied simultaneously to the storage devices and the clocks are phased appropriately. The correct phasing of clocks and data is achieved electronically or with predetermined delay lines which will operate at one prescribed frequency. Since the demultiplexer described uses simultaneous data and simultaneous clocks, it does not require phase shifting devices and further it can operate at any frequency determined by the clock.

BRIEF DESCRIPTION OF THE DRAWING

The present invention will now be described, by way of example, with reference to the accompanying drawing, wherein:

FIGS. 5(a) to (f) are waveform diagrams which assist in the understanding of the operation of the decision circuit shown in FIG. 4, FIG. 9 is a block schematic circuit diagram of a demultiplexer, and FIGS. 10(A) to 10(F) are waveform diagrams which assist in the understanding of the operation of the demultiplexer of FIG. 9.

DETAILED DESCRIPTION

Figure 1:
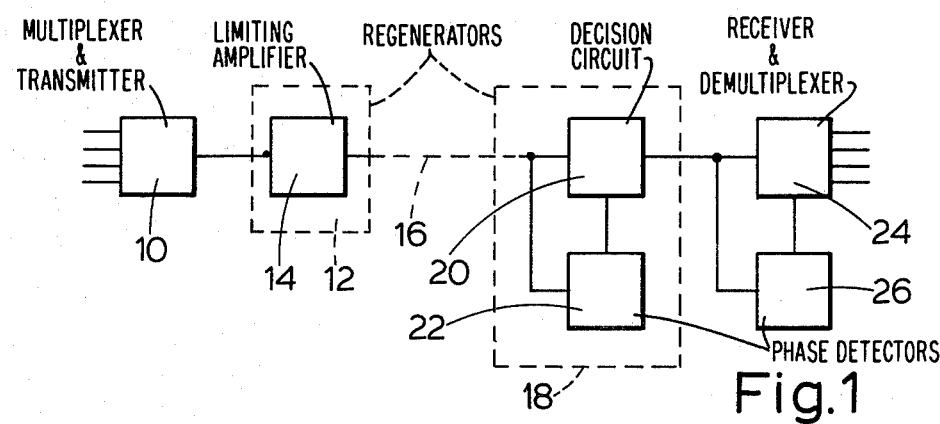
FIG. 1 is a block schematic diagram of a PCM tranmission system.

FIG. 1 shows diagrammatically a signal transmission system including a multiplexer and transmitter shown collectively at 10; several regenerators 12 of which only one has been shown, each regenerator 12 including a limiting amplifier 14 for restandardizing the transmitted signal with respect to amplitude; a further regenerator 18 including a decision circuit 20 for retiming, that is removing jitter in, and restandardizing the signal, and a clock extraction phase detector 22 for deriving a clock signal from the transmitted data; and a receiver and demultiplexer 24 to which is connected a clock extraction phase detector 26.

The number of regenerators 12 and 18 in a line 16 depends among other things on the overall length of the line. Further, it is not essential that each regenerator include a decision circuit and a clock extraction phase detector because although it is necessary to restandardize a signal at each regenerator it is not always necessary to retime it.

Figure 2:
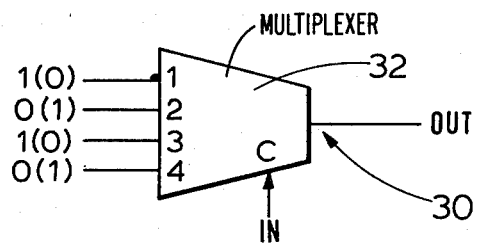
FIG. 2 is a block schematic diagram of a limiting amplifier.

An embodiment of a limiting amplifier 30 will now be described with reference to FIG. 2. The amplifier 30 is based on a four-input multiplexer circuit 32 which may comprise the circuit described with reference to FIG. 6 of British Patent Specification No. 1,552,739. However, unlike a customary multiplexer circuit which receives clock signals on its clock input c, in FIG. 2 a pulse-code-modulated (PCM) data signal which has been distorted through transmission is applied to the clock input c. The four input ports 1 to 4 of the multiplexer 32 are held fixed with static voltages which in the case of a noninverting limiting amplifier are arranged as follows ports 1 and 3— logical 1 and ports 2 and 4— logical 0. Thus, on each transition of the data signal applied to the input c, a corresponding restandardize output is obtained, the sequence being unaltered.

Figure 3A:
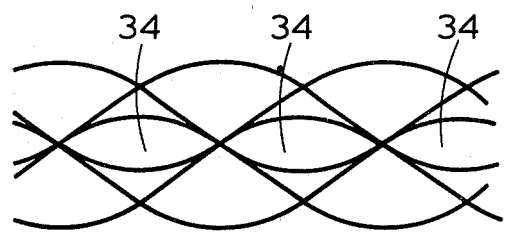
FIGS. 3A and 3B show the improved "eye" obtained by the limiting amplifier.
Figure 3B:
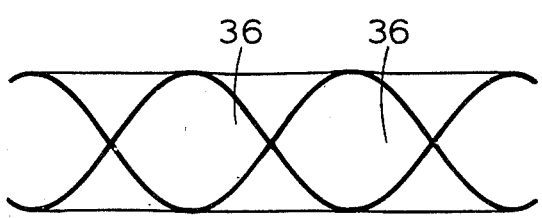

FIG. 3A shows on eye diagram of a distorted input data signal applied to the input c of the multiplexer 32 and FIG. 3B the output. It will be noted that the eyes 34 in the distorted data input signal are improved and given full amplitude as shown at 36 in the output from the limiting amplifier 30.

If it is desired to invert the data signal then this can be achieved by changing the static voltages on the ports 1 to 4 so that ports 1 and 3 are logical 0 and ports 2 and 4 are logical 1.

Figures 4, 5:
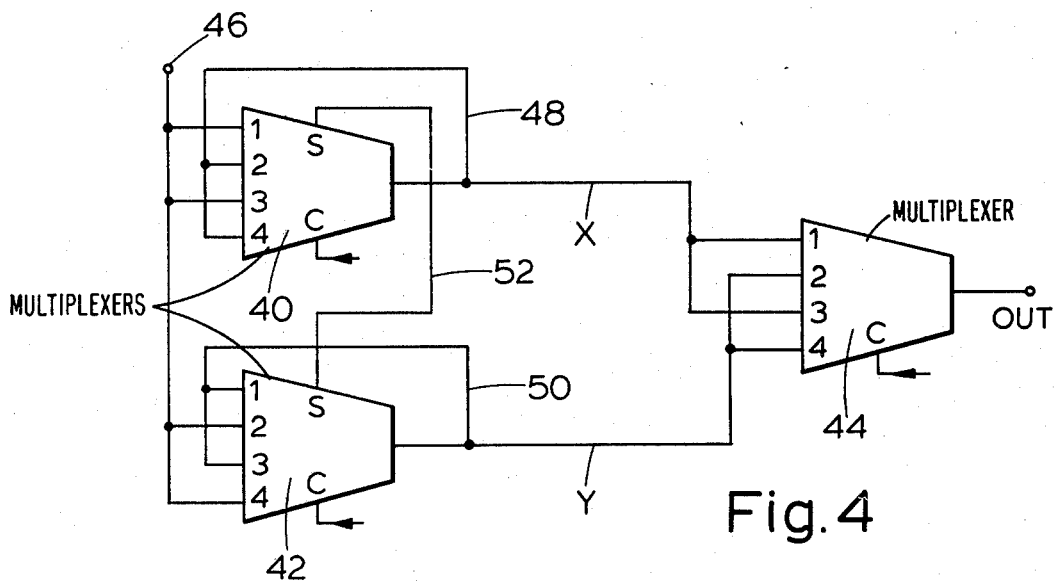
FIG.4 is a block schematic diagram of a decision circuit.

FIG. 4 is a block schematic circuit diagram of an embodiment of a decision circuit which is able to operate with a clock frequency which is half the bit rate in the P.C.M. data stream, in other words a clock frequency of 600 MHz can be used with a 1.2 Gigabit/second data stream. This is made possible by using three 4-input port multiplexers 40, 42 and 44 which each have a forward gain greater then one and which are able to switch on each transition of a clock signal. Conveniently the multiplexers 40, 42 and 44 may be of the type disclosed in British Patent Specification 1,552,737.

The data signal to be restandardized and retimed is applied via an input terminal 46 to the input ports 1 and 3 of the multiplexer 40 and to the input ports 2 and 4 of the multiplexer 42. A feedback connection 48 connects an output X of the multiplexer 40 to its input ports 2 and 4, and a feedback connection 50 connects an output Y of the multiplexer 42 to its input ports 1 and 3. The output X is applied to input ports 1 and 3 of the multiplexer 44 and the output Y is applied to input ports 2 and 4 of the multiplexer 44.

Corresponding clock signals are applied to the clock inputs c of the multiplexers 40 and 42 and a delayed clock signal is applied to the clock input c of the multiplexer 44. The clock signals in practice will be derived from the clock extraction phase detector to be described with reference to FIGS. 6 to 8. Optionally the sync inputs s of the multiplexers 40, 42 may be interconnected by, for example, a conductor 52.

FIGS. 5(A) to (F) are timing diagrams illustrating the operation of the decision circuit of FIG. 4. FIG. 5(A) illustrates a data sequence A to J applied to the input terminal 46. The multiplexers 40 and 42 are clocked coherently (FIG. 5(B)) so that correspondingly numbered input ports sample at the same time. As indicated in FIG. 5(B) the clock is set with its half period equal in duration but staggered relative to the data time slots shown in FIG. 5(A). With the input ports 1 selected, the multiplexer 40 samples the data, first in the time slot A and then in the time slot B so that at the start of the input ports 2 being selected the output X, FIG. 5C, has assumed the data in the time slot B. With input ports 2 selected multiplexer 42 samples the data, first in the time slot B and then in the time slot C. At the start of the input ports 3 being selected, the output Y, FIG. 5D, has become C. Simultaneously the multiplexer 40 has its input port 2 supplied from its output which was left with the data from the time slot B. By making the forward gain of the multiplexers 40, 42 greater than 1 then the data from time slot B will remain at X until input ports 3 are selected. Similarly the data from the time slot C remains at Y until input ports 4 are selected. In this manner the data from time slots B, D, F— appear at X and from time slots A, C, E— appear at Y, for durations exceeding a time slot.

The outputs X and Y are interleaved by the multiplexer 44 which receives a delayed clock signal, FIG. 5(E), compared with the clock signal, FIG. 5(B), applied to the multiplexers 40 and 42. The output, FIG. 5(F), comprises a regenerated and retimed version of the data at the input 46. Retiming of the data streams X and Y occurs at each transition of the clock and the output time slot corresponds to a half-period of the clock, hence the clock frequency needs only to be half that of the bit rate.

Figure 6:
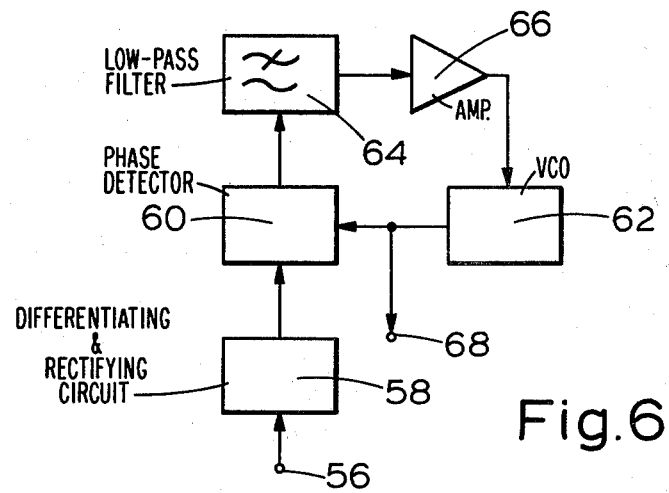
FIG. 6 is a block schematic circuit diagram of a phase-locked loop clock extractor.

The clock signal is derived from the incoming data stream using a phase locked loop clock extractor of the type shown in FIG. 6. The clock extractor is based on a conventional phase-locked loop clock extractor but includes a phase detector 60 capable of extracting a clock signal at half the data frequency, which clock signal can be used to operate the decision circuit of FIG. 4. The phase detector will be described with reference to FIG. 7.

Figure 8:
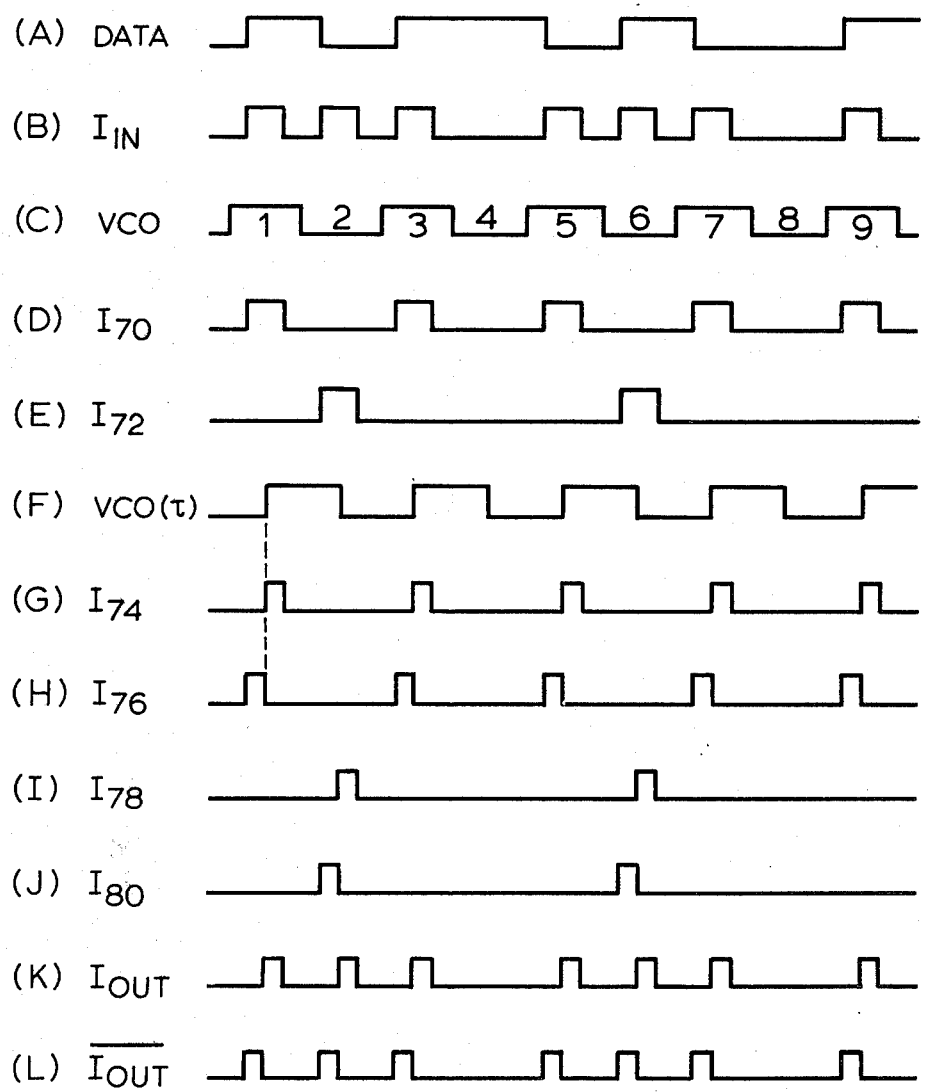
FIGS. 8(A) to 8(L) are waveform diagrams which assist in the understanding of the operation of the phase detector of FIG. 7.

Referring initially to FIG. 6 and some of the waveforms shown in FIG. 8, incoming data signal, FIG. 8A, applied to an input terminal 56 passes to a differentiating and rectifying circuit 58 which produces a pulse on each change or transition of the data signal, FIG. 8B. These pulses are applied to one input of the phase detector 60 which has a second input to which is applied a signal from a voltage controlled oscillator (VCO) 62. In the present case the VCO 62 produces a signal at half the bit rate. The phase detector 60 mixes the signals applied to its inputs. If there is an error in phase than an output signal is applied to a low pass filter 64. The signal from the filter 64 is amplified in an amplifier 66 and is applied as a correction voltage to adjust the output frequency of the VCO 62. The output clock signal is derived from a terminal 68. For one particular phase of the clock, the phase detector 60 gives zero output and the loop locks.

Figure 7:
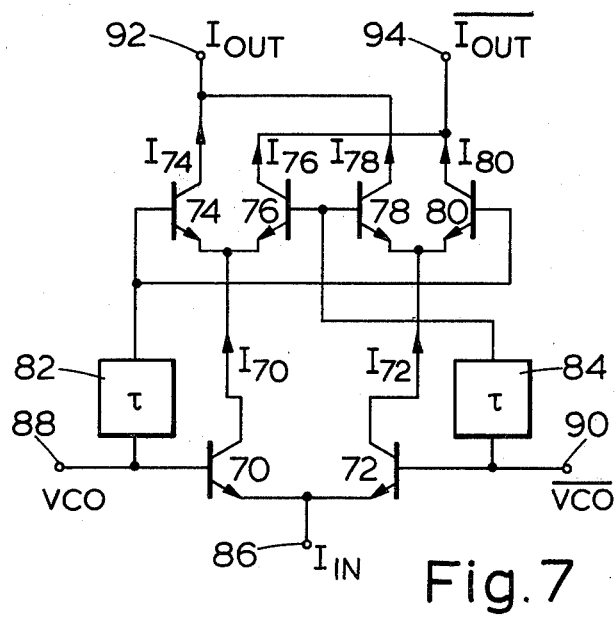
FIG. 7 is a schematic circuit diagram of a phase detector used in the clock extractor.

Referring now to FIGS. 7 and 8, the phase detector 60 comprises three pairs of long-tailed pair connected NPN transistors 70, 72, 74, 76 and 78, 80 and two delay circuits 82, 84. These devices are connected together in the following manner. The signal, FIG. 8B, from the differentiating and rectifying circuit 58 is applied to an input terminal 86 which is connected to the junction of the emitters of the transistors 70, 72. The VCO signal and $\overline{VCO}$ signal are applied via input terminals 88, 90, respectively, to the bases of the transistors 70, 72. The collectors of the transistors 70, 72 are connected, respectively, to the junctions of the emitters of the transistors 74, 76 and 78, 80. The delay circuit 82 is connected between the terminal 88 and the bases of the transistors 74, 80 and the delay circuit 84 is connected between the terminal 90 and the bases of the transistors 76, 78. The collectors of the transistors 74, 78 are connected together and to an $I_{OUT}$ terminal 92 and the collectors of the transistors 76 and 80 are connected to an $\overline{I_{OUT}}$ terminal 94.

In operation the VCO and $\overline{VCO}$ signals are applied respectively to the terminals 88, 90. The VCO signal is illustrated in FIG. 8C but the $\overline{VCO}$ signal has not been shown because it is simply the inversion of the VCO signal. When emitter current $I_{IN}$ is flowing at terminal 86 then either the transistor 70 or 72 will conduct, depending on whichever transistor 70, 72 has the higher base voltage to provide current $I_{70}$, FIG. 8D, and $I_{72}$, FIG. 8E, on one or other collector, respectively. The VCO and $\overline{VCO}$ signals are delayed by approximately 90° of phase in the circuits 82 and 84—for convenience only VCO ($\tau$) has been shown in FIG. 8F. Assuming that the VCO signal is in phase, then the transitions in the VCO ($\tau$) signal will occur substantially midway through any $I_{70}$ or $I_{72}$ pulses. Whenever the current $I_{70}$, $I_{72}$ is flowing in the emitters of the transistor pairs 74, 76, 78 and 80, then the transistors 74, 76, 78 and 80 will conduct, depending on whichever transistor has a high base voltage, to provide the currents $I_{74}$, $I_{76}$, $I_{78}$ and $I_{80}$ on their collectors as shown in FIGS. 8G to 8J. The signals from the collectors of the transistors 74, 78 are combined to form the $I_{OUT}$ signal, FIG. 8K, on the terminal 92 and in a similar way an $I_{\overline{OUT}}$ signal on the terminal 94 is formed by combining the signals on the collectors of the transistors 76, 80.

FIG. 9 illustrates schematically a demultiplexing circuit which is able to recover data which has been transmitted at a certain bit rate, e.g. 1.2 Gigabits/second, using a clock signal derived from the incoming data and having a frequency half that of the bit rate e.g. 600 MHz.

The demultiplexer of FIG. 9 comprises four four-input multiplexers 96, 98, 100 and 102 of a suitable type, for example as disclosed in FIG. 6 of British Patent Specification No. 1,552,739, which can be switched on each transition of a clock signal. The incoming data on input terminal 104 is applied to input port 1 of multiplexer 96, input port 2 of multiplexer 98, input port 3 of multiplexer 100 and input port 4 of multiplexer 102. The remainder of the input ports of each multiplexer are connected together and are coupled to the output of the associated multiplexer by a feedback connection. As shown, the clock signal is applied via a line 106 to all the clock inputs c of the multiplexers 96 to 102. Each of the multiplexers 96 to 102 has an output for its respective channel and for convenience these have been referenced OUT1, 2, 3 and 4.

In describing the operation of the demultiplexer of FIG. 9 it must be remembered that the multiplexers 96 to 102 are synchronized so that the inputs of each multiplexer are selected coherently. Each input port of all the multiplexers 96 to 102 is selected in turn for a half period of the common clock on the line 106. Data is sent in common to input port 1 of the multiplexer 96, input port 2 of the multiplexer 98, input port 3 of the multiplexer 100 and input port 4 of the multiplexer 102. The remaining three input ports of each multiplexer are commoned and fed from their output.

Referring now to FIG. 10, consider the data sequence, FIG. 10A, defined by time slots A–J. The clock, FIG. 10B, is set with its half period equal in duration but staggered with respect to the data time slot. With input ports 1 selected, the multiplexer 96 samples the data, first in the time slot A and then in the time slot B so that at the start of input ports 2 being selected, OUT1, FIG. 10C, is set to the data of time slot B. With input ports 2 selected, the multiplexer 98 samples the data, first in the time slot B and then in the time slot C. At the start of input ports 3 being selected, OUT2, FIG. 10D, has been set to the data in time slot C. Simultaneously the multiplexer 96 has its input port 2 supplied from its output which was left with data from time slot B. If all the multiplexers have a forward gain greater than 1 then the data from the time slot B will remain at OUT1 until input 1 is next selected (i.e. during the time slot E). Similarly OUT2, FIG. 10D, OUT3, FIG. 10E and OUT4, FIG. 10F, will be set to C, D and E as shown. As is apparent that data input stream is dispersed into four parallel channels where OUT1 acquires data from the time slots B, F, —. OUT2 acquires data from slots C, G —, OUT3 acquires data from time slots D, H, —and OUT4 acquires data from time slots E, I —. Hence a 1.2 Gigabit/second data stream can be demultiplexed with a 600 MHz clock.

I claim:

1. A phase-locked-loop clock extractor for extracting a clock frequency of N/2 cycles per second from a transmitted pulse-code-modulated (PCM) data signal of N bits per second, the clock extractor comprising a voltage controlled oscillator (VCO) for generating a clock signal of the desired frequency, a circuit connected to receive the transmitted data signal and produce a pulse signal on each transition of the data signal from one logic level to another and vice versa, a phase detector for comparing the VCO output with the pulse signal produced by said circuit and means connected to the phase detector for producing a control signal which is used for adjusting the frequency generated by the VCO, the phase detector comprising a first switching circuit operable on each half cycle of the VCO frequency to route said pulse signal to second and third switching circuits, each of the second and third switching circuits having first and second outputs, means for delaying the VCO output, each of the second and third switching circuits being operable on each half cycle of the VCO frequency which has been delayed by a predetermined amount compared with the VCO frequency applied to the first switching circuit by said means for delaying the VCO output to produce pulse trains on their first and second outputs, the pulses in each pulse train comprising complementary parts of the corresponding pulses routed to the second and third switching circuits by the first switching circuit, means for combining corresponding first parts of the pulses appearing on the first output of the second and third switching circuits to form a first output signal (IOUT) and means for combining corresponding second parts of the pulses appearing on the second output of the second and third switching circuits to form a second output signal ($I_{OUT}$), said first and second output signals being used by said means connected to the phase detector to produce the control signal.

2. A clock extractor as claimed in claim 1, wherein the VCO output signal applied to the second and third switching circuits is delayed by approximately a quarter of the period of the VCO output by said means for delaying the VCO output.

3. A P.C.M. transmission system comprising at least one regenerator having a phase-locked-loop clock extractor as claimed in claim 1 or 2, and a decision circuit for retiming the signal received by the regenerator, the decision circuit comprising first and second four-input-port multiplexers each having an output (X, Y), the odd-numbered input ports of the first multiplexer and the even-numbered input ports of the second multiplexer being coupled to a signal input of the decision circuit, a connection from an output of the first multiplexer to its even-numbered input ports, a connection from an output of the second multiplexer to its odd-numbered output ports, a clock input (c) of each of the first and second multiplexers being coupled to the VCO, the output of which is phased so that the zero cross-over occurs substantially midway through the bit period, and switching means connected to the outputs (X, Y) of the first and second multiplexers for selecting said outputs (X, Y) alternately, on each zero cross-over of the clock signal, to produce a retimed P.C.M. signal on its output.

4. A system as claimed in claim 3, in which the switching means comprises a further four-input-port multiplexer and in which the VCO signal applied to its clock input is delayed compared with that applied to the first and second multiplexers.

5. A system as claimed in claim 3, further comprising a regenerator including a limiting amplifier for restandardizing the amplitude of the signal received by the regenerator, the limiting amplifier comprising a multiplexer having an even number of input ports, a clock input (c) and an output, wherein the odd numbered input ports are maintained at one logic level, the even numbered input ports are maintained at a second logic level and the clock input is connected to receive the P.C.M. signal to be restandardized.

6. A P.C.M. transmission system comprising a receiver having a demultiplexer and a phase-locked loop clock extractor as claimed in claim 1 or 2, the demultiplexer comprising an input and K multiplexers, each multiplexer having a gain greater than one, K input ports, an output (OUT) and a clock signal input (c), the clock signal inputs being coupled together and to the VCO output which is phased such that the zero crossover of the clock signal occurs midway through a data time slot period, the input of the demultiplexer being connected to the first input port of the first multiplexer, the second input port of the second multiplexer and so on till the Kth input port of the Kth multiplexer, the output of each multiplexer being connected to all the other of its input ports, whereby each multiplexer in turn samples the input for half a clock period and holds the signal occurring in the second half of the sampling period for (K-1) further sampling periods, corresponding to (K-1)/2 clock periods.

* * * * *